United States Patent
Lin et al.

[11] Patent Number: 6,133,143
[45] Date of Patent: Oct. 17, 2000

[54] METHOD OF MANUFACTURING INTERCONNECT

[75] Inventors: Jy-Hwang Lin, Kaohsiung; Ching-Hsing Hsieh, Pingtung Hsien; Yueh-Feng Ho, Hsinchu Hsien; Chia-Chieh Yu, Taipei Hsien, all of Taiwan

[73] Assignees: United Semiconductor Corp.; United Microelectronics Corp., both of Hsinchu, Taiwan

[21] Appl. No.: 09/340,928

[22] Filed: Jun. 28, 1999

[51] Int. Cl.$^7$ ................................ H01L 21/4763
[52] U.S. Cl. ................. 438/627; 438/648; 438/677; 438/725
[58] Field of Search ................... 438/627, 628, 438/641, 648, 653, 654, 655, 677, 680, 725

[56] References Cited

U.S. PATENT DOCUMENTS

| 5,599,739 | 2/1997 | Merchant et al. | 438/653 |
| 5,643,642 | 7/1997 | Lo | 427/250 |
| 5,874,360 | 2/1999 | Wyborn et al. | 438/680 |
| 5,895,265 | 4/1999 | Inoue et al. | 438/643 |

OTHER PUBLICATIONS

Fujimura, et al., "Resist Stripping in an O2 + H2O plasma downstream," J. Vacuum Science & Technology B, vol. 9, No. 2, Pt. 1, Mar./Apr. 1991, pp. 357–361.

Fujimura et al., "Resist stripping in an O2 + H2O plasma downstream", J. Vacuum Science & Technology B, vol. 9, No. 2, Pt. 1, the abstract, Mar. 1991.

*Primary Examiner*—T. N. Quach
*Attorney, Agent, or Firm*—Thomas, Kayden, Horstemeyer & Risley

[57] ABSTRACT

The invention provides a method of manufacturing a metal interconnect. A substrate having a metal line formed thereon is provided. An anti-reflection layer is formed on the metal line. A dielectric layer with a relatively low dielectric constant is formed over the substrate. A patterned photoresist layer is formed on the dielectric layer. The patterned photoresist layer has an opening exposing a portion of the dielectric layer. The portion of the dielectric layer exposed by the opening is removed to form a via hole. The patterned photoresist layer is removed by an $O_2$—$H_2O$—$CF_4$ plasma. The pressure of the $O_2$—$H_2O$—$CF_4$ plasma is about 800–1000 torr. A cleaning process is performed by a post-stripper rinse solution and de-ionized water without using an acetone solution. A barrier layer is formed over the substrate by chemical vapor deposition. A metal nucleation is performed for a long time by chemical vapor deposition to form metal nuclei on the barrier layer. A metal layer is formed to fill the via hole by chemical vapor deposition.

11 Claims, 4 Drawing Sheets

METHOD OF MANUFACTURING INTERCONNECT

BACKGROUND OF THE INVENTION

1. Field of Invention

The present invention relates to a method of manufacturing multilevel interconnects. More particularly, the present invention relates to a method of manufacturing a via plug.

2. Description of Related Art

In the semiconductor manufacturing process, the devices are connected to each other through the metal interconnects. Generally, an inter-metal dielectric (IMD) layer is used to electrically isolate two adjacent metal layers from each other. Moreover, a conductive layer used to electrically connect the two adjacent metal layers is called a via plug in the semiconductor industry. The location in the metal layer used to connect to the via plug has an allowance border to make sure that the via plug can be completely located on the surface of the metal layer, in what is known as a landed via plug.

When the design rules becomes small, there is no allowance border at the location in the metal layer used to connect to the via plug to increase the integration. This is known as a borderless structure. But the borderless via plug manufacturing process is relatively difficult. When misalignment occurs, the via plug may not be completely located on the metal layer, which is called an unlanded via plug.

In order to increase the operation efficacy of the devices and decrease the resistance-capacitance time delay effect, a new orientation forms a dielectric layer with a relatively low dielectric constant between the metal layers. However, a via plug formed in the dielectric layer with a relatively low dielectric constant leads to several problems, especially when misalignment occurs.

FIGS. 1A through 1C are schematic, cross-sectional views of the conventional process for manufacturing a via plug made of dielectric material with a low dielectric constant.

As shown in FIG. 1A, an oxide layer 104 is formed on a substrate 100 including metal lines 102. In order to obtain an even surface, a dielectric material 106 with a low dielectric constant is formed to fill gaps 107 between the metal lines 102. An oxide layer 108 is deposited over the substrate 100 to form a sandwich-structure dielectric layer.

As shown in FIG. 1B, a patterned photoresist layer 110 is formed on the oxide layer 108. The oxide layer 108 is patterned to form a via hole 112 while using the patterned photoresist layer 110 as an etching mask.

As shown in FIG. 1C, the photoresist layer 110 is stripped by oxygen plasma. A cleaning process is performed to remove the remaining photoresist layer and the manufacturing process by-product by acetone solution, post-stripper rinse solution and de-ionized water. The via hole 112 is filled with metal layer 114 to finish the via plug manufacturing process.

In order to form the via holes with different depths, it is common to perform over-etching process during the formation of the via hole 112 in the oxide layer 108. However, the etching rate of the dielectric layer 106 with a low dielectric constant is larger than that of the oxide layer 108. Therefore, the via hole 112 exposes and may penetrate the dielectric material 106, even to the point of penetrating through the via hole 112 when the misalignment occurs. The Si—H bonds of the dielectric material 106 exposed by the misalignment via hole are oxidized into the Si—OH bonds in the subsequent processes of removing the photoresist layer 110 and the cleaning process. The vapor is produced from the Si—OH bonds by filling the via hole 112 with the metal layer 114 at a high temperature, so that it is difficult to till the via hole 112 with the metal layer 114 and the step coverage of the metal layer 114 in the via hole 112 is worse. Both the keyhole 116 and the poisoned via plug occur due to the formation of the vapor.

SUMMARY OF THE INVENTION

The invention provides a method of manufacturing a metal interconnect. A substrate having a metal line formed thereon is provided. An anti-reflection layer is formed on the metal line. A dielectric layer with a relatively low dielectric constant is formed over the substrate. A patterned photoresist layer is formed on the dielectric layer. The patterned photoresist layer has an opening exposing a portion of the dielectric layer. The portion of the dielectric layer exposed by the opening is removed to form a via hole. The patterned photoresist layer is removed by an $O_2$—$H_2O$—$CF_4$ plasma. The pressure of the $O_2$—$H_2O$—$CF_4$ plasma is about 800–1000 torr. A cleaning process is performed by a post-stripper rinse solution and de-ionized water without using an acetone solution. A barrier layer is formed over the substrate by chemical vapor deposition. A metal nucleation is performed to form metal nuclei on the barrier layer for a long time by chemical vapor deposition. A metal layer is formed to fill the via hole by chemical vapor deposition.

The invention provides a via plug metallization process. A substrate having a dielectric layer formed thereon is provided. The dielectric layer has a via hole formed therein. A barrier layer is formed over the substrate by chemical vapor deposition. A metal nucleation is performed for a long time by chemical vapor deposition to form metal nuclei on the barrier layer. A metal layer is formed to fill the via hole by chemical vapor deposition.

In the invention, the ARC is used as an etching stop layer during the formation of the via holes and the over-etching process is performed for a short time to completely open the via holes. Therefore, the dielectric layer with a relatively low dielectric constant will not be penetrated through by the via hole when misalignment occurs. Hence, the poor step coverage and the electrical problems caused by the penetrated via hole can be avoided. Additionally, the patterned photoresist layer is removed by the $O_2$—$H_2O$—$CF_4$ plasma with a relatively low pressure of about 800–1000 torr, so that the probability that the Si—H bonds are oxidized into Si—OH bonds is decreased. Therefore, the poisoned via plug can be avoided. Moreover, the probability of removing the polymers produced during the etching procedure is increased, the rate of removing the photoresist layer can be decreased and the duration of photoresist layer removal is extended, so that the probability of removing the polymers produced during the etching procedure is increased. Furthermore, after the patterned photoresist layer is removed, very little polymer remains over the substrate, so that the cleaning process is performed without using acetone solution after the patterned photoresist layer is removed. Therefore, the poisoned via plug in the subsequent process caused by the cleaning solution for removing polymer can be prevented. Incidentally, in the metallization process, since the duration of the metal nucleation process in the invention is longer than that of the conventional metal nucleation process, the metal nuclei are finely and uniformly formed on the barrier/adhesion layer. Therefore, the step coverage ability of the subsequently formed tungsten layer is improved and the keyhole will not occur.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2F are schematic, cross-sectional views of the process for manufacturing a metal interconnect.

Figure 1A:
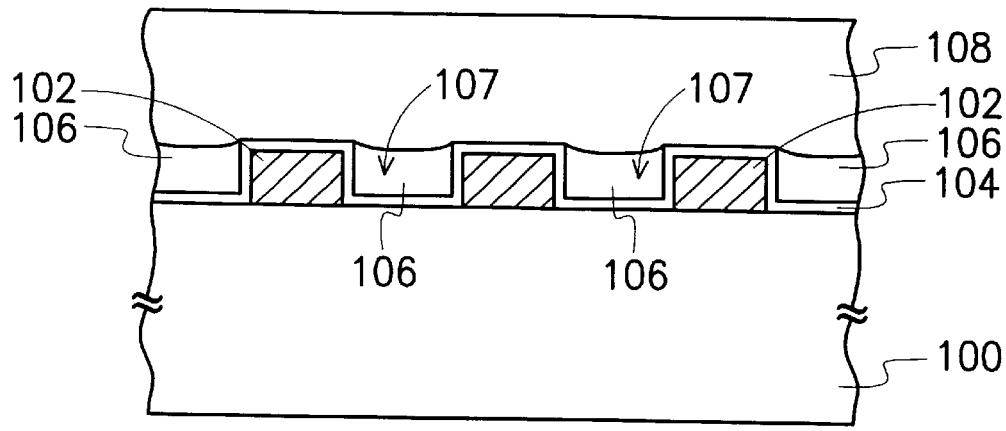
FIGS. 1A through 1C are schematic, cross-sectional views of the conventional process for manufacturing a via plug made of dielectric material with a low dielectric constant.
Figure 1B:
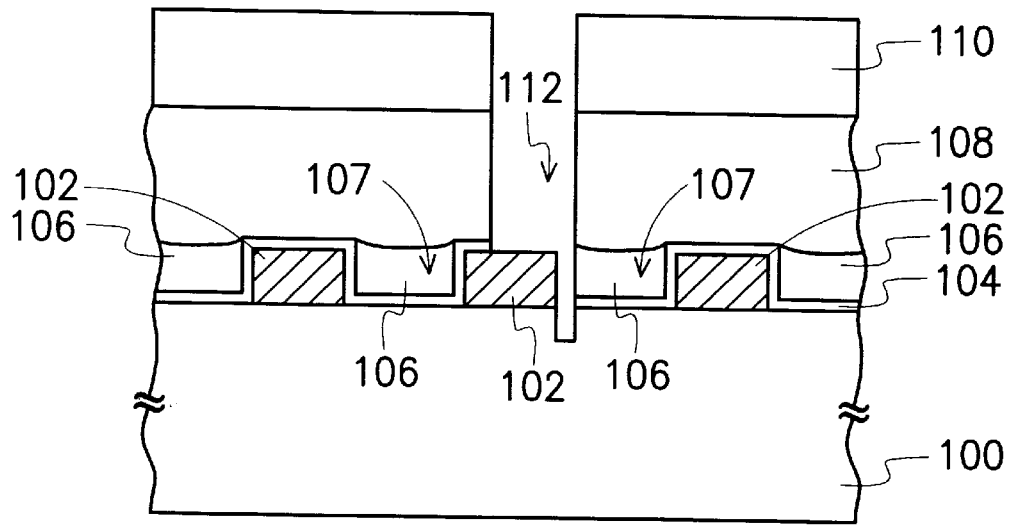
Figure 1C:
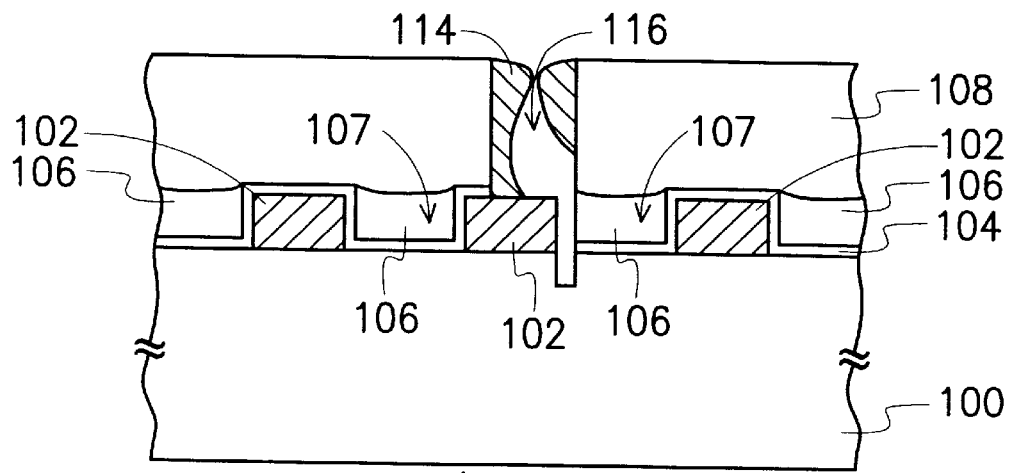
Figure 2A:
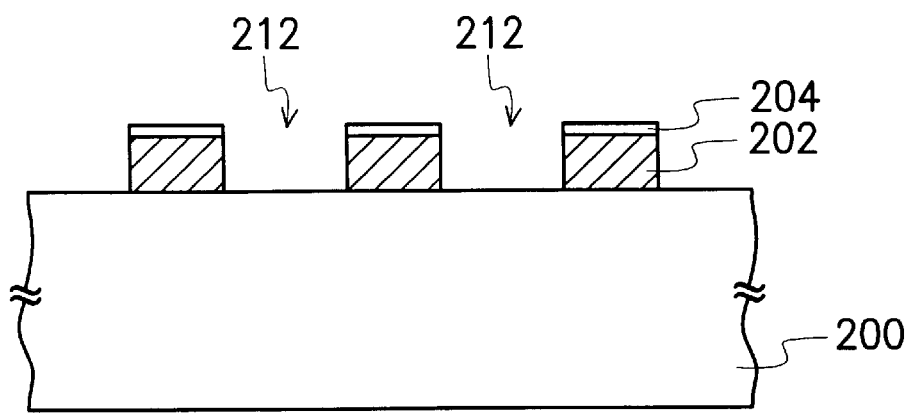
FIGS. 2A through 2F are schematic, cross-sectional views of the process for manufacturing a metal interconnect.

As shown in FIG. 2A, a substrate 200 having metal lines 202 formed thereon is provided. The material of the metal lines 202 can be aluminum, aluminum-copper alloy or copper, for example. In order to avoid the photolithography problems caused by the reflection from the metal during the patterning process used to form the metal lines 202, it is usual to cover the metal line 202 with an anti-reflection layer (ARC) 204 to decrease the reflection ability of the metal. The ARC 204 can be formed from titanium or titanium/titanium nitride by chemical vapor deposition (CVD) or sputtering, for example.

Figure 2B:
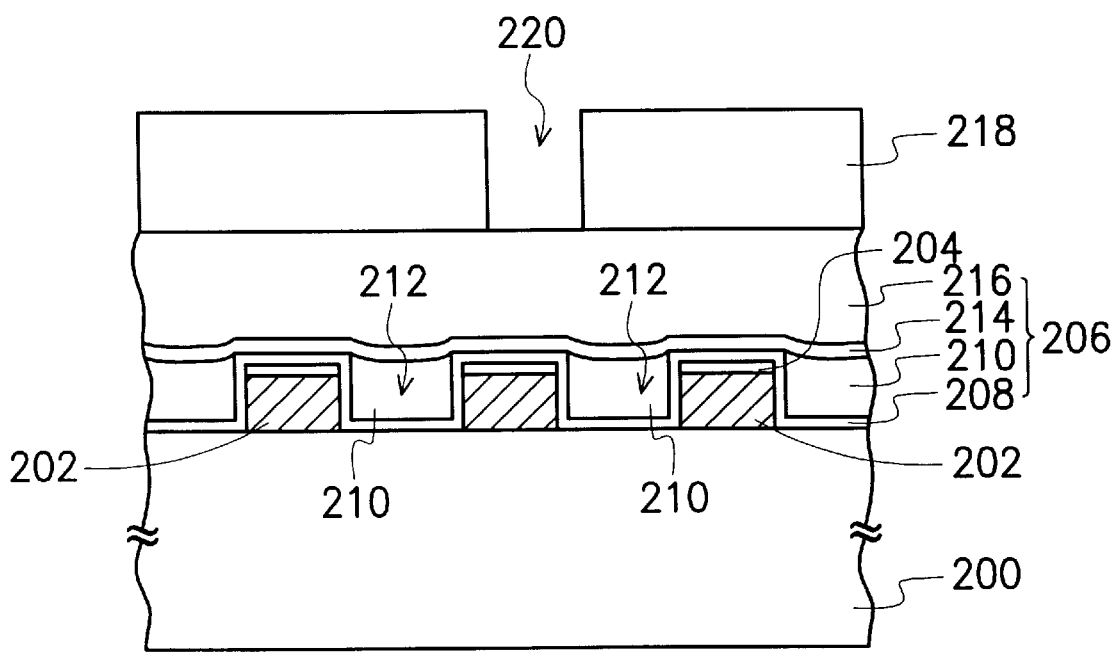

As shown in FIG. 2B, a dielectric layer 206 is formed over the substrate 200. The dielectric layer 206 has relatively low dielectric constant. The material of the dielectric layer 206 can be spin-on glass (SOG) with a relatively low dielectric constant such as hydrogen silsesquioxane (HSQ). Preferably, the method of forming the dielectric layer 206 comprises forming a silicon-rich oxide 208 over the substrate 200 by CVD, coating a dielectric layer 210 with a relatively low dielectric constant, such as SOG, over the substrate 200 to fill gaps 212 between the metal lines 202, forming a doped oxide layer 214 over the substrate 200, forming an oxide layer 216 over the substrate 200 by plasma-enhanced chemical vapor deposition (PECVD), and then performing a planarizing process on the oxide layer 216. The planarizing process can be chemical-mechanical polishing (CMP), for example.

A patterned photoresist layer 218 having an opening 220 is formed on the dielectric layer 206. A portion of the dielectric layer 206 exposed by the opening 220 is a predetermined location for a via hole formed subsequently and it aligns with the metal line 202.

Figure 2C:
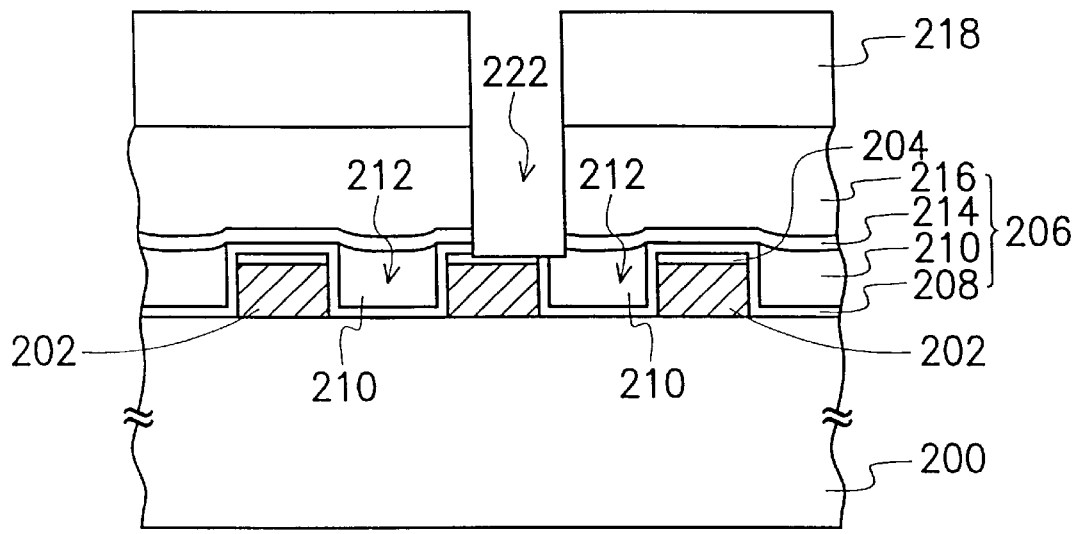

As shown in FIG. 2C, the portion of the dielectric layer 206 exposed by the opening 220 is removed to form a via hole 222. The method for removing the portion of the dielectric layer 206 can be anisotropic etching, for example. Preferably, the method of removing the portion of the dielectric layer 206 comprises adjusting the component of the etching gas until the etching selective ratio of ARC 204 to dielectric layer 206 is relatively low, and then performing an over-etching process by using the ARC 204 as an etching stop layer to finish the formation of the via holes 222 with different depths. Additionally, the gas source used in the anisotropic etching is a fluorine-containing gas such as $CF_4$, $CH_3F$, $C_2F_6$ and $C_3F_8$.

In the invention, the ARC 204 is used as an etching stop layer (luring the formation of the via holes 222, so that the over-etching can be performed in a short time to form the via holes 222 with different depths when misalignment occurs. Hence, the worse metal step coverage and the electrical problems caused by the penetration of the via holes 222 can be avoided.

Figure 2D:
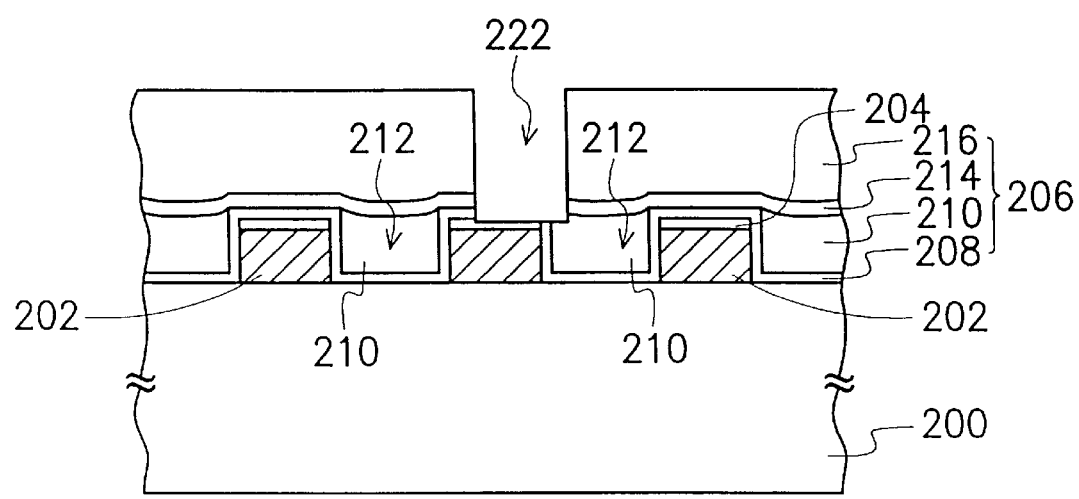

As shown in FIG. 2D, the patterned photoresist layer 218 is removed by the $O_2$—$H_2O$—$CF_4$ plasma with low pressure. The pressure of the $O_2$—$H_2O$—$CF_4$ plasma is about 800–1000 millitorr. Since the $O_2$—$H_2O$—$CF_4$ plasma is used instead of the conventional $O_2$ plasma and the pressure of the $O_2$—$H_2O$—$CF_4$ plasma is relatively low, the probability that the Si—H bonds are oxidized into Si—OH bonds is decreased. Therefore, the poisoned via plug can be avoided. Moreover, the rate of removing the photoresist layer can be decreased and the duration of photoresist layer removal is extended, so that the probability of removing the polymers produced during the etching procedure is increased.

After that, a cleaning process is performed. In the invention, the solution used to perform the cleaning process only includes post-stripper rinse solution, such as N-Methylpyrolidone (NMP), and de-ionized water. Since the patterned photoresist layer 218 is removed by the $O_2$—$H_2O$—$CF_4$ plasma with a relatively low pressure, very little polymer remains over the substrate 200. Therefore, the cleaning process is performed without acetone solution after the patterned photoresist layer 218 is removed by the $O_2$—$H_2O$—$CF_4$ plasma with a relatively low pressure. Hence, the cleaning goal can be achieved and the poisoned via plug in the subsequent process caused by the cleaning solution for removing polymer can be prevented.

Figure 2E:
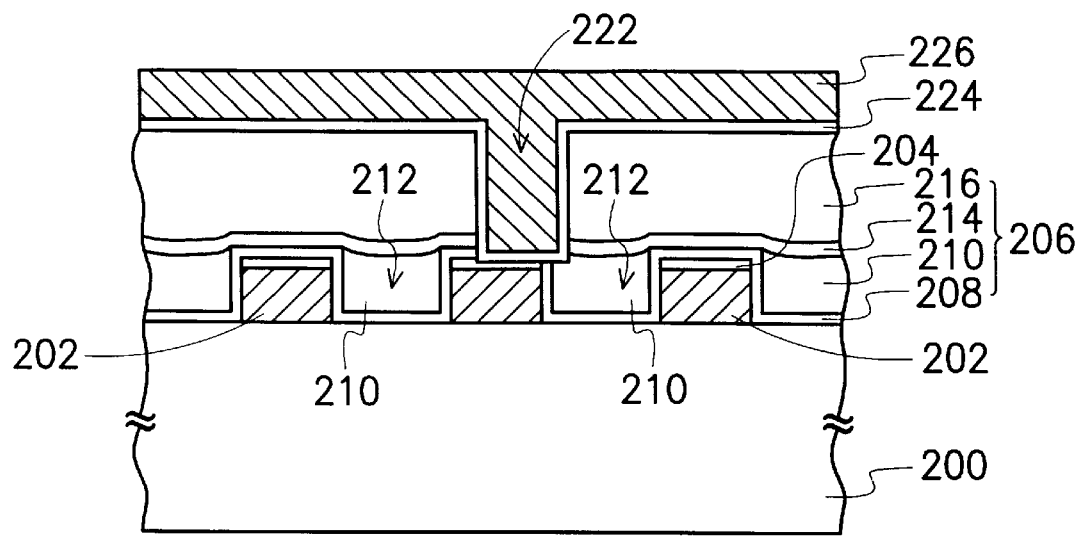

As shown in FIG. 2E, a via plug metallization process is performed. In this example, a barrier/adhesion layer 224 is formed over the substrate 200 and on the sidewall and the bottom of the via hole 222. The barrier/adhesion layer 224 is used to increase the adhesion between the dielectric layer 206 and the metal layer subsequently formed in the via hole 222 and to prevent the devices from developing reliability problems caused by the diffusion of the metal atoms from the metal layer subsequently formed in the via hole 222 to the dielectric layer 206. The material of the barrier/adhesion layer 224 can be titanium or titanium/titanium nitride, for example. In order to improve the step coverage ability, the method of forming the barrier/adhesion layer 224 can be chemical vapor deposition, for example.

After that, a metal layer 226 is formed over the substrate 200 and fills the via hole 222. The material of the metal layer 226 can be tungsten, for example. Preferably, the method of forming the metal layer 226 comprises performing a metal nucleation process on the barrier/adhesion layer 224 through CVD for a long time, and then forming the metal layer 226 over the substrate 200 to fill the via hole 222 by CVD. Taking tungsten as an example, in the metallization process, the tungsten nucleation is performed for about 1.5–2 minutes, and then a tungsten layer is formed to fill the via hole 222. Since the duration of the tungsten nucleation process in the invention is longer than that of the conventional tungsten nucleation process, the tungsten nuclei are finely and uniformly formed on the titanium/titanium nitride barrier/adhesion layer. Therefore, the step coverage ability of the subsequently formed tungsten layer is improved and the keyhole will not occur.

Figure 2F:
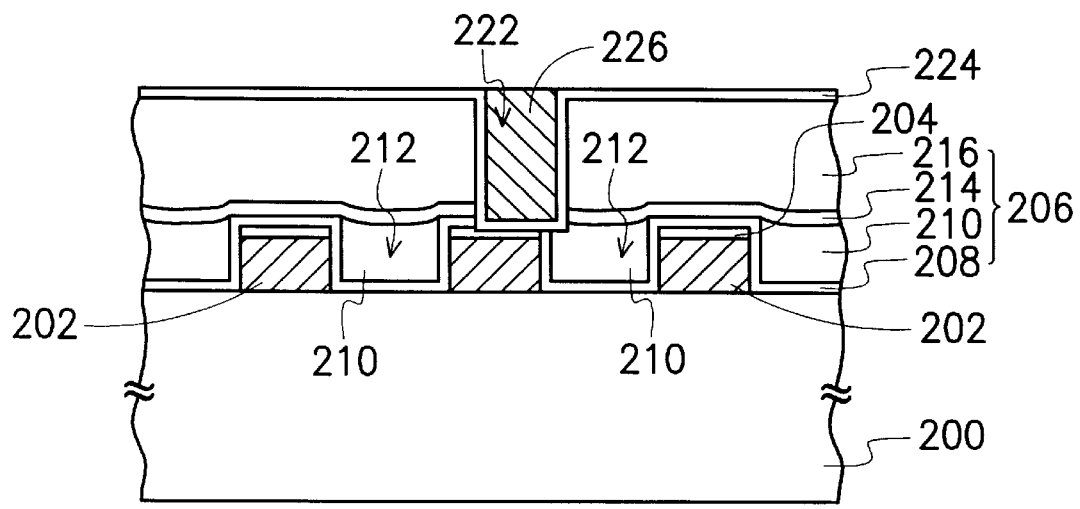

As shown in FIG. 2F, a portion of the metal layer 226 is removed until the surface of the barrier/adhesion layer 224 is exposed. The remaining metal layer 226 in the via hole 222 is used as a via plug. The method of removing the portion of the metal layer 226 can be etching back with the barrier/adhesion layer 224 serving as an etching stop layer or CMP with the barrier/adhesion layer 224 serving as a polishing stop layer, for example.

Altogether, the invention provides the following advantages:

1. In the invention, the ARC is used as an etching stop layer during the formation of the via holes and the over-etching process is performed for a short time to completely open the via holes. Therefore, the dielectric layer with a relatively low dielectric constant will not be penetrated through by the via hole. Hence, the poor step coverage and the electrical problems caused by the penetrated via hole can be avoided.

2. In the invention, the patterned photoresist layer is removed by the $O_2$—$H_2O$—$CF_4$ plasma with a relatively low pressure of about 800–1000 torr. Therefore, the poisoned via plug can be avoided. Moreover, the probability of removing the polymers produced during the etching procedure is increased.

3. After the patterned photoresist layer is removed, very little polymer remains over the substrate, so that the cleaning process is performed without using acetone solution after the patterned photoresist layer is removed. Therefore, the poisoned via plug in the subsequent process caused by the cleaning solution for removing polymer can be prevented.

4. In the metallization process, since the duration of the metal nucleation process in the invention is longer than that of the conventional metal nucleation process, the metal nuclei are finely and uniformly formed on the barrier/adhesion layer. Therefore, the step coverage ability of the subsequently formed tungsten layer is improved and the keyhole will not occur.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal interconnect, comprising the steps of:
   providing a substrate having a metal line formed thereon, wherein an etching stop layer is formed on the metal line;
   forming a dielectric layer over the substrate;
   forming a patterned photoresist layer on the dielectric layer, wherein the patterned photoresist layer has an opening exposing a portion of the dielectric layer;
   removing the portion of the dielectric layer exposed by the opening to form a via hole;
   removing the patterned photoresist layer by an $O_2$—$H_2O$—$CF_4$ plasma pressurized at about 800–1000 torr;
   performing a cleaning process with a post-stripper rinse solution and de-ionized water;
   forming a barrier layer over the substrate by chemical vapor deposition;
   performing a metal nucleation by chemical vapor deposition to form a plurality of metal nuclei on the barrier layer; and
   forming a metal layer to fill the via hole by chemical vapor deposition.

2. The method of claim 1, wherein the step of performing the cleaning process only uses post-stripper rinse and de-ionized water, without acetone, to reduce a probability of Si—OH bond formation.

3. The method of claim 1, wherein the post-stripper rinse solution includes N-Methylpyrolidone.

4. The method of claim 1, wherein the step of performing the metal nucleation includes forming a plurality of tungsten nuclei for 1.5–2 minutes.

5. The method of claim 4, wherein the metal layer is made of tungsten.

6. The method of claim 1, wherein the barrier layer comprises a titanium layer and a titanium nitride layer.

7. The method of claim 1, wherein the step of removing the portion of the dielectric layer exposed by the opening to form the via hole uses an anti-reflection layer as an etching stop layer.

8. The method of claim 1, wherein the dielectric layer is made of hydrogen silsesquioxane.

9. A method of removing a photoresist layer formed on a dielectric layer and used to form a via hole in the dielectric layer, the method comprising:
   removing the photoresist layer by an $O_2$—$H_2O$—$CF_4$ plasma pressurized at about 800–1000 torr; and
   performing a cleaning process with a post-stripper rinse solution and de-ionized water.

10. The method of claim 9, wherein the step of performing the cleaning process only uses post-stripper rinse and de-ionized water, without acetone, to reduce a probability of Si—OH bond formation.

11. The method of claim 10, wherein the post-stripper rinse solution includes N-Methylpyrolidone.

* * * * *